(12) United States Patent
McCoy

(10) Patent No.: US 8,289,050 B2
(45) Date of Patent: Oct. 16, 2012

(54) SWITCHING CIRCUITS, LATCHES AND METHODS

(75) Inventor: John McCoy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/887,074

(22) Filed: Sep. 21, 2010

(65) Prior Publication Data

US 2012/0068750 A1    Mar. 22, 2012

(51) Int. Cl.
*H03K 19/00* (2006.01)
(52) U.S. Cl. .............................. 326/94; 326/27; 327/198
(58) Field of Classification Search ........................ 326/21, 326/26–27, 94; 327/198
See application file for complete search history.

(56) References Cited

U.S. PATENT DOCUMENTS

| | | | | |
|---|---|---|---|---|
| 5,187,385 A * | 2/1993 | Koike | ........................... | 327/198 |
| 5,365,122 A * | 11/1994 | Rackley | ........................ | 327/306 |
| 5,388,225 A * | 2/1995 | Cantrell et al. | ............... | 710/306 |
| 5,789,945 A * | 8/1998 | Cline | .............................. | 326/94 |
| 6,184,701 B1 * | 2/2001 | Kim et al. | ........................ | 326/21 |
| 6,384,619 B1 * | 5/2002 | Kim et al. | ........................ | 326/21 |
| 6,781,431 B2 * | 8/2004 | Taito et al. | ...................... | 327/291 |
| 6,906,555 B2 * | 6/2005 | Ma | ................................... | 326/94 |
| 2009/0024888 A1* | 1/2009 | Kurimoto | ...................... | 714/731 |
| 2009/0315601 A1* | 12/2009 | Priel et al. | ...................... | 327/161 |
| 2010/0164929 A1* | 7/2010 | Chen et al. | ..................... | 345/211 |

\* cited by examiner

*Primary Examiner* — Jason M Crawford
(74) *Attorney, Agent, or Firm* — Dorsey & Whitney LLP

(57) ABSTRACT

Switching circuits, latches and methods are provided, such as those that may respond to an input signal that transitions from a first binary level to a second binary level. One such switching circuit may have a metastable state that is closer to a first voltage corresponding to the first binary level than it is to a second voltage corresponding to the second binary level. In other embodiments, the metastable state may be dynamically adjustable so that it is at one voltage before the circuit switches and at a different voltage after the circuit switches. As a result, the switching circuit may respond relatively quickly to the input signal transitioning from the first binary level to the second binary level.

21 Claims, 3 Drawing Sheets

SWITCHING CIRCUITS, LATCHES AND METHODS

TECHNICAL FIELD

Embodiments of this invention relate to digital circuits, and, more particularly, to increasing the switching speeds of switching circuits.

BACKGROUND OF THE INVENTION

Various digital circuits may respond to transitions of a digital signal from one binary level to another. These digital circuits may respond to a digital input signal by transitioning a digital output signal between two binary levels, which may be the same binary levels as the input signal or some other levels As digital circuits switch from one binary state to another, they may transition through a "metastable state" in which an output signal has not yet reached either level. In many cases, this metastable state is at a voltage that is at the mid-point between voltages corresponding to the two binary levels of the output signal. Although the existence of this metastable state may not pose a problem in many applications, in others it may prevent a digital circuit from properly responding to a digital input signal. For example, if an input signal transitions from a first binary level to a second binary level, and then quickly transitions back to the first binary level, the circuit may never transition through the metastable state. As a result, the output signal will remain at the same binary level.

Another example of a circuit in which metastable states may pose a problem is a latch circuit in which a first digital circuit has its input coupled to the output of a second digital circuit, and the output of the first digital circuit is coupled to the input of the second digital circuit. In such case, there are two stable states in which the output of the latch circuit can remain at either of two binary levels, and a metastable state between these two binary levels. If an input signal transitions from a first level to a second level, the latch should switch states. However, if one of the digital circuits has not transitioned through the metastable state either before the input signal has switched back to the first level or after the input signal is no longer being applied, the latch may not switch state in response to the input signal. Even if the digital circuit has transitioned through the metastable state and thus causes the latch to switch state, it may require an excessive time for the state change of the latch to occur. This slow response speed may be due to the relatively weak drive power of one of the digital circuits when a received input signal is at or close to the metastable state. As a result, the operating speed of digital circuits may be undesirably limited.

DETAILED DESCRIPTION

Figure 1:
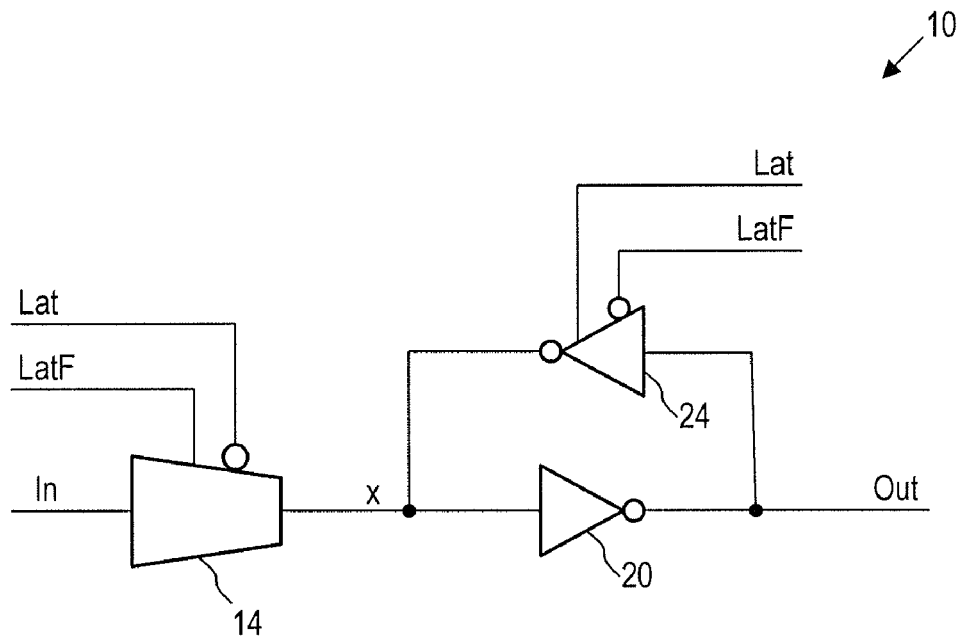
FIG. 1 is a schematic diagram of an embodiment of a prior art latch using digital circuits.

A typical prior art latch 10 using digital circuits is shown in FIG. 1. The latch 10 may include a multiplexer 14 receiving an input signal In at its input, and providing an output signal "X" at its output. The multiplexer 14 may be switched by an active low signal Lat and its complement LatF. The output signal X may be applied to a pair of cross-coupled inverters 20, 24, one of which 20 may receive the signal X at its input. The other inverter 24 may be selectively enabled by the active high signal Lat and its complement LatF. The output of the inverter 20 provides an output signal Out. Each of the inverters 20, 24 may be implemented with a p-channel transistor (not shown) having a source coupled to a first voltage, such as a power supply voltage, a gate coupled to receive an input signal, and a drain coupled to an output signal node. Each of the inverters 20, 24 may also include an n-channel transistor (not shown) having a source coupled to a second voltage, such as ground, a gate coupled to receive the input signal, and a drain coupled to the output signal node.

In operation, the multiplexer 14 may be switched to a conductive state and the inverter 24 may be disabled by pulsing the Lat signal low and the LatF signal high for a short period, thereby applying the input signal In to the input of the inverter 20. However, when the In signal is coupled through the multiplexer 14 to the inverter 20, the inverter 20 may begin to change state to transition the output signal Out. Once the inverter 20 has responded to the input signal In, the multiplexer 14 may be disabled and the inverter 24 enabled by transitioning the Lat signal high and the LatF signal low. When the inverter 24 is enabled, it may begin to change state responsive to the signal at the output of the inverter 20, thereby latching the input of the inverter 20 to the signal level that was applied through the multiplexer 14. Once these state changes have occurred, the inverters 20, 24 may be latched in a stable state. However, when the multiplexer 14 is disabled and the inverter 24 is enabled, if the signals Out and X are not at either binary state i.e., they are in a metastable state intermediate the binary states, then it might take a long period of time for the respective signal levels at the outputs of the inverters 20, 24 to resolve to binary states. Thus, the existence of a metastable state in the inverters 20, 24 may unduly slow the switching speed of the latch 10. More specifically, if the inverters 20, 24 have switched just slightly beyond their metastable states, the drive power of the inverters 20, 24 may be relatively low because both transistors in the inverters 20, 24 may be still conductive. As a result, the voltage output from the respective inverters 20, 24 may not be at the levels they would be in at either binary state so that the drive power of the inverters 20, 24 may be relatively low. The latch circuit 10 may therefore take an excessive time to switch states.

Figure 2A:
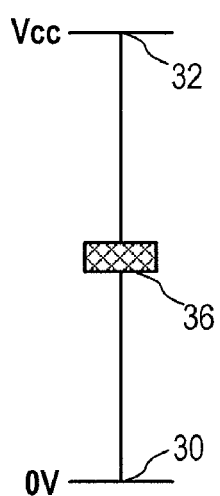
FIGS. 2A, 2B, and 2C are illustrative diagrams illustrating an operating principle of a digital circuit according to one embodiment.
Figure 2B:
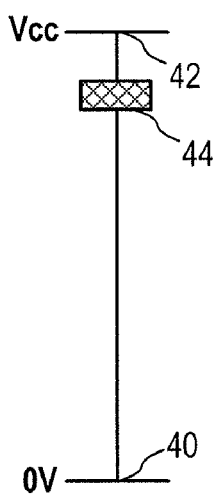
Figure 2C:
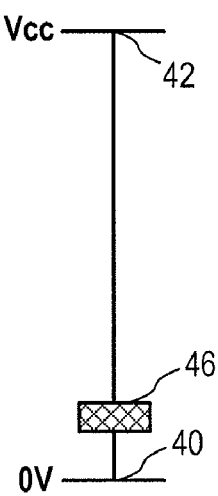

An operating principle of a digital circuit according to one embodiment that may improve the performance of digital circuits is shown in FIGS. 2A-2C. As shown in FIG. 2A, a prior art digital circuit generally has two binary states 30, 32 corresponding to respective binary voltages. For purposes of illustration, the state 30 will be referred to as binary state "0" corresponding to a relatively low voltage, and the state 32 will be referred to as binary state "1" corresponding to a relatively high voltage, such as Vcc. In switching between these two states 30, 32, the digital circuit passes through a metastable state 36 that may be at the midpoint between the respective voltages corresponding to the two states 30, 32. As explained above, performance limitations may result from the digital circuit being in this metastable state 36 rather than at one of two binary signal levels.

As shown in FIG. 2B, an embodiment of one digital circuit may also have two binary states 40, 42 and a metastable state 44 at a voltage that is significantly closer to the binary 1 state than it is to the binary 0 state. As a result, the digital circuit may switch state at an earlier time than it otherwise would if the metastable state 44 was located midway between the binary states 40, 42, such as shown in FIG. 2A. As shown in FIG. 2C, when the digital circuit is transitioning from the binary 0 state to the binary 1 state, the digital circuit may be configured so that it has a metastable state 46 at a voltage that is significantly closer to the binary 0 state than it is to the binary 1 state. As a result, the digital circuit may again switch state at an earlier time than it otherwise would if the metastable state 46 was located midway between the binary states 40, 42.

Embodiments of the digital circuit may thus be configured to shift the voltage of the metastable state 36 to two different voltages that are closer to the voltages corresponding to the two binary states 40, 42. However, in other embodiments, the metastable state 36 may be permanently shifted toward one of the two binary states 40, 42 for various reasons, such as the concern being only with the transition of the digital circuit from the binary state corresponding to the voltage that is closer to the metastable state 46. In still other embodiments, the metastable state 36 may be shifted to two different voltages for respective transitions, but the two different metastable states 44, 46 may be at different voltages from the respective binary states 42, 40. For example, if the voltages corresponding to the binary states are 0 and 3 volts, one metastable state 46 may be at 2.8 volts (i.e., 0.2 volts from the voltage of state 1), and the other metastable state 44 may be at 1 volt (i.e., 1 volt from the voltage of state 0). In still other embodiments, one of the metastable states may be at a voltage that is midway between the two binary voltages.

Figure 3:
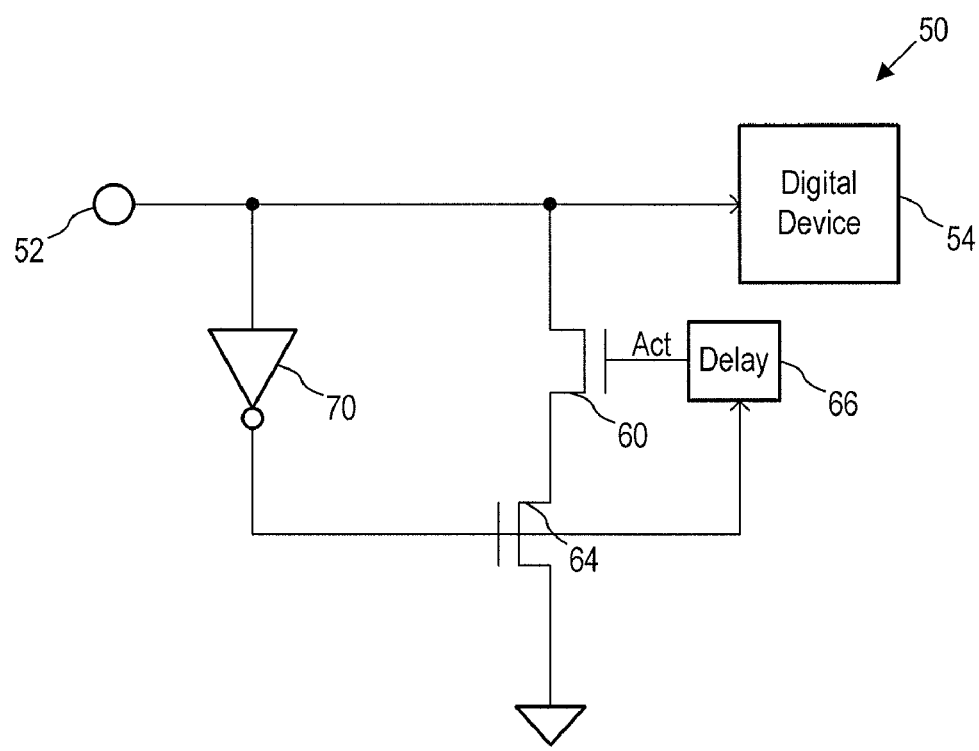
FIG. 3 is a schematic diagram of an embodiment of a digital circuit that may more quickly respond to input signal transitions in one direction.

An embodiment of a digital circuit 50 that may shift the metastable state for only one type of transition is shown in FIG. 3. The digital circuit 50 may include an input node 52 coupled to a digital device 54, which may switch between two binary values through a meta-stable voltage that may be midway between the two voltages corresponding to the two binary values. The digital device 54 may be, for example, the latch 10 shown in FIG. 1, in which case the input node 52 may be coupled to the input of the inverter 20. The series combination of a first transistor, such as an n-channel transistor 60, and a second transistor, which may also be an n-channel transistor 64, is coupled between the input of the digital circuit and a voltage node, such as ground. A gate of the transistor 60 may be coupled to receive an actuating signal Act signal from a delay circuit 66, and a gate of the transistor 64 may be coupled to an output of a signal transition detector, such as an inverter 70. The inverter 70's input may switch between a first binary state corresponding to a first voltage level, such as a relatively high voltage level, and a second binary state corresponding to a second voltage level, such as a relatively low voltage level. In such case, the inverter 70 may have a metastable state that is closer to the relatively high voltage level corresponding to the first binary state than it is to the relatively low voltage level corresponding to the second binary state. The output of the inverter 70 may also be coupled to an input of the delay circuit 66. The switching point of the inverter 70 may be configured to have a switching point that is closer to the relatively high voltage level corresponding to the first binary state than it is to the relatively low voltage level by using transistors that are configured to have different drive capabilities, which may result from the transistors having different electrical characteristics. For example, a channel of one transistor may have width-to-length ratio that is different from the width-to-length ratio of a channel in the other transistor.

Figure 4:
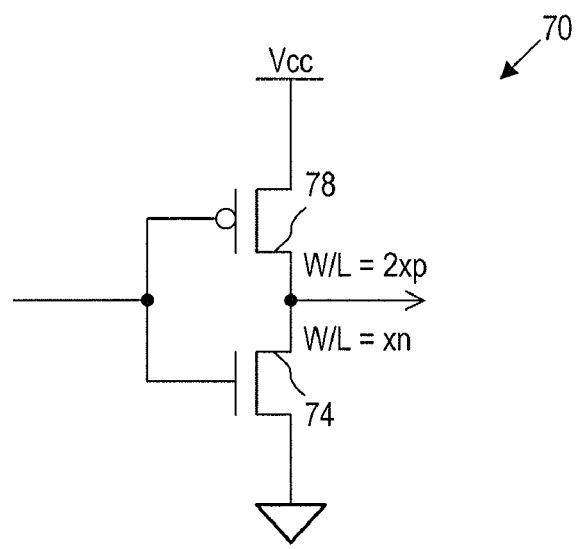
FIG. 4 is a schematic diagram of an embodiment of an inverter that may be used in the digital circuit of FIG. 3 or in a digital circuit according to some other embodiment.
Figure 3A:
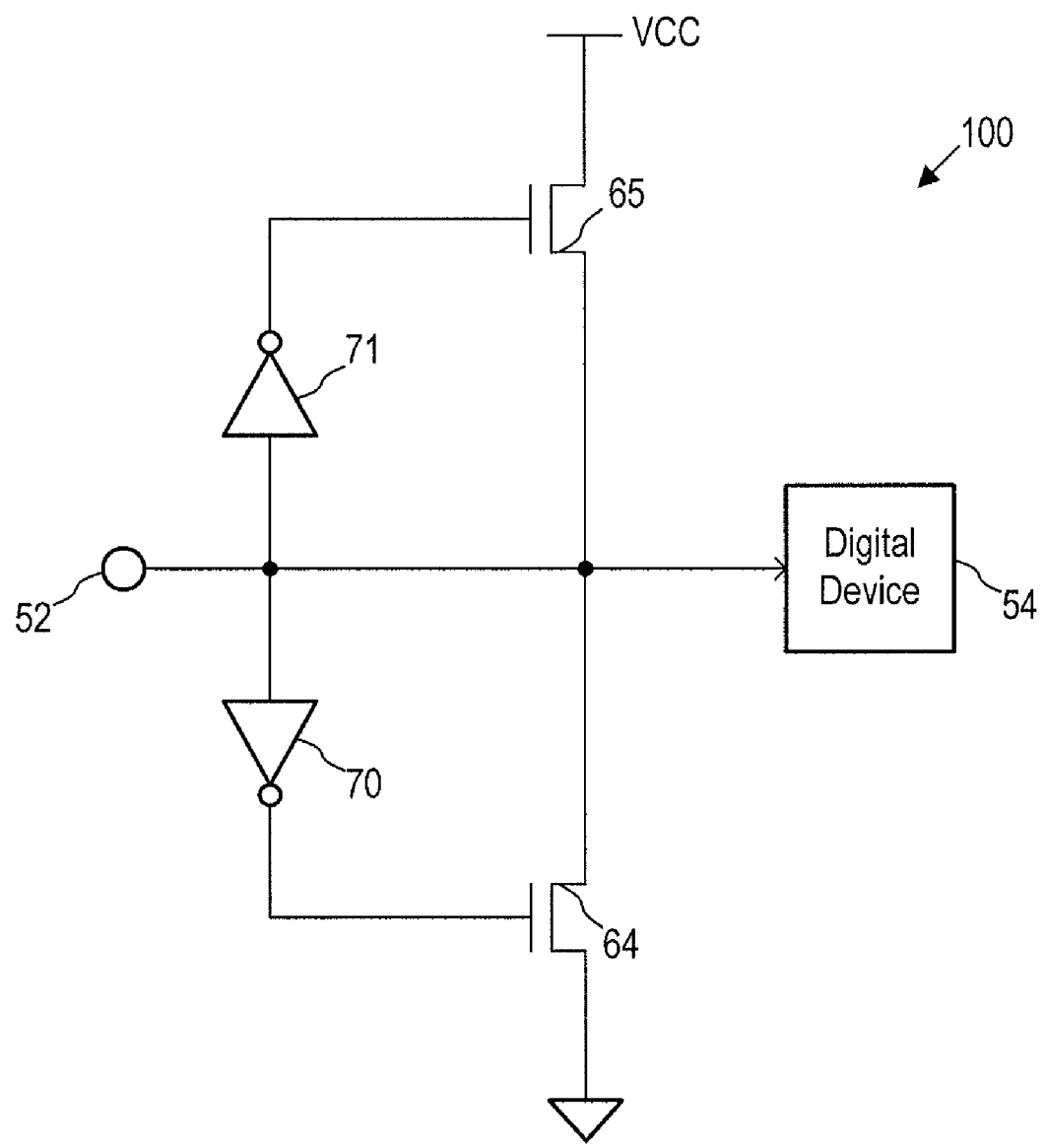
FIG. 3a is a schematic diagram of an embodiment of a digital circuit that may quickly respond to input signal transitions in one or more directions.

By way of further example shown in FIG. 4, an embodiment of the inverter 70 may have a first transistor, such as an NMOS transistor 74, with a channel width-to-length ratio equal to a value Xn, and a second transistor, such as a PMOS transistor 78, with a channel width-to-length ratio equal to a value of 2Xp, where Xn and Xp are the respective width-to-length ratios of the transistors 74, 78 that would make the switching point of the inverter 70 midway between the respective voltage levels corresponding to the two binary states.

In operation, a high-to-low transition of an input signal In applied to the input node 52 may cause the output of the inverter 70 to transition from low-to-high. This high level then causes the transistor 64 to turn ON. The low-to-high transition at the inverter 70 also actuates the delay circuit 66 so that an active high Act signal is provided after a delay period to turn ON the transistor 60. At the same time, the high-to-low transition of the input signal In may cause the digital circuit 54 to begin switching. However, insofar as the switching point voltage of the inverter 70 may be at a higher voltage than the metastable state voltage of the digital circuit 54, the transistor 64 may turn ON and the delay circuit 66 may be actuated before the digital circuit 54 begins transitioning, and may therefore cause the digital circuit 54 to begin switching earlier than it might otherwise switch. The inverter 70, transistors 60, 64 and delay circuit 66 may thus effectively serve to shift the metastable state of the digital circuit 54 so that the digital circuit 54 can respond to the transition of the input signal In even if the transition is for a very short period of time. Furthermore, even if the duration of the low input signal In is for a duration that is long enough for the digital circuit 54 to respond without the shift in the metastable state voltage, the shift of the metastable state of the digital circuit 54 may cause the digital circuit 54 to respond more quickly than it otherwise would. The shifting of the metastable state of the digital circuit 54 may also resolve problems other than the transition from one binary state to another. For example, if a signal applied to the input node 52 is at some voltage level intermediate the respective voltage levels of the two binary states, it may still transition in the proper manner because the metastable state has been shifted toward one of the two binary states.

Although the inverter 70 used in the embodiment of FIG. 3 may have a switching point that is permanently shifted toward the relatively high voltage level corresponding to the first binary state, in other embodiments the inverter 70 or some other circuit may have a metastable state or switching point that is dynamically varied depending upon, for example, the level of the signal applied to the input node 52. In still other embodiments, a control circuit may be used in place of or in addition to the delay circuit 66.

Although the present invention has been described with reference to the disclosed embodiments, persons skilled in the art will recognize that changes may be made in form and detail without departing from the invention. Such modifications are well within the skill of those ordinarily skilled in the art. Accordingly, the invention is not limited except as by the appended claims.

I claim:

1. A method of switching a digital circuit that is configured to respond to an input signal, the method comprising:
   providing the input signal to the digital circuit and first and second signal level detectors, the first signal level detector configured to have a metastable state closer to a first voltage corresponding to a first binary level than a second voltage corresponding to a second binary level and the second signal level detector configured to have a metastable state closer to the second voltage than the first voltage; and providing a metastable output signal from at least one of the first and second signal level detectors to the digital circuit responsive, at least in part, to the input signal transitioning.

2. The method of claim 1 wherein the digital circuit comprises a latch circuit.

3. The method of claim 1 wherein the first metastable state is closer to the first voltage than the second metastable state is to the second voltage.

4. The method of claim 1 wherein a difference in magnitude between the first voltage and a voltage corresponding to the first metastable state is substantially the same as a difference in magnitude between the second voltage and a voltage corresponding to the second metastable state.

5. The method of claim 1 wherein the act of providing a metastable output signal occurs at the end of a delay period.

6. A method of switching a digital circuit that is configured to provide an output signal responsive to an input signal transitioning between a first voltage and a second voltage, the method comprising:

when switching from an input signal having the first voltage to an input signal having the second voltage, transitioning the output signal from a third voltage to a fourth voltage responsive to a first signal level detector generating a first metastable signal having a voltage closer to the first voltage than the second voltage; and when switching from an input signal having the second voltage to an input signal having the first voltage, transitioning the output signal from the fourth voltage to the third voltage responsive to a second signal level detector generating a second metastable signal having a voltage closer to the second voltage than the first voltage.

7. The method of claim 6 wherein the third voltage is substantially equal to the first voltage, and the fourth voltage is substantially equal to the second voltage.

8. The method of claim 6 wherein the voltage of the first metastable signal is closer to the first voltage than the voltage of the second metastable signal is to the second voltage.

9. An apparatus, comprising:
a node;
a first signal level detector configured to receive an input signal at the node, the first signal level detector being configured to provide an output signal responsive to the input signal transitioning through a first switching point when transitioning from a first voltage to a second voltage, the switching point being at a voltage that is closer to the first voltage than to the second voltage;
a second signal level detector configured to receive the input signal at the node, the second signal level detector being configured to provide an output signal responsive to the input signal transitioning through a second switching point when transitioning from the second voltage to the first voltage, the difference between the first voltage and a voltage corresponding to the first switching point being substantially the same as the difference between the second voltage and a voltage corresponding to the second switching point;
a digital circuit coupled to the node and configured to receive the input signal, the digital circuit further configured to respond to the input signal transitioning;

a first switch configured to drive the node to a first voltage responsive to receiving the output signal provided by the first signal level detector; and
a second switch configured to drive the node to a second voltage responsive to receiving the output signal provided by the second signal level detector.

10. The apparatus of claim 9 wherein at least one of the first and second signal level detectors comprises an inverter.

11. The apparatus of claim 10 wherein the inverter comprises:
a first transistor of a first type having a first driving power; and
a second transistor of a second type that is different from the first type, the second transistor being coupled in series with the first transistor, the second transistor having a second driving power that is greater than the first driving power.

12. The apparatus of claim 10 wherein the inverter comprises:
a first transistor of a first type; and
a second transistor of a second type that is different from the first type, the second transistor being coupled in series with the first transistor, the second transistor having an electrical characteristic that is different from an electrical characteristic of the first transistor.

13. The apparatus of claim 12 wherein the first transistor includes a first channel and the second transistor includes a second channel, the first channel having a width-to-length ratio that is greater than a width-to-length ratio of the second channel.

14. The apparatus of claim 9, further comprising a delay circuit having an input coupled to an output of the first signal level detector and an output coupled to the first switch, the delay circuit configured to cause the first switch to drive the node to the first voltage a delay period after receiving the output signal from the signal level detector.

15. An apparatus, comprising:
a signal level detector configured to provide an output signal responsive to a signal transitioning through a switching point when the signal is transitioning from a first voltage to a second voltage, the switching point being at a voltage that is closer to the first voltage than to the second voltage;
a switch configured to drive a node to a particular voltage responsive to receiving the output signal provided by the signal level detector, wherein the switch comprises a first transistor having one of a source and a drain coupled to the node and another of the source and the drain coupled to a supply voltage node, the first transistor having a gate coupled to receive the output signal provided by the signal level detector;
a delay circuit coupled to receive a signal corresponding to the output signal provided by the signal level detector, the delay circuit being configured to provide a delayed output signal a particular delay period after receiving the signal corresponding to the output signal provided by the signal level detector control signal; and
a second transistor having a source and a drain coupled in series with the first transistor between the node and the supply voltage node, the second transistor having a gate coupled to receive the delayed output signal from the delay circuit.

16. The latch of claim 15 wherein the particular voltage to which the switch drives the input to the first inverter is substantially equal to the second voltage.

17. The latch of claim 15 wherein the signal level detector comprises a first signal level detector having a first switching point, and wherein the switch comprises a first switch, the latch further comprising:
- a second signal level detector configured to provide an output signal responsive to a transitioning through a second switching point when the signal is transitioning from the second voltage to the first voltage, the second switching point being at a voltage that is closer to the second voltage than to the first voltage; and
- a second switch configured to drive the node to a particular voltage responsive to receiving the output signal provided by the second signal level detector.

18. The latch of claim 17 wherein a difference between the second voltage and the voltage of the second switching point is greater than a difference between the first voltage and the voltage of the first switching point.

19. The latch of claim 17 wherein the particular voltage to which the first switch drives the node is substantially equal to the second voltage, and the particular voltage to which the second switch drives the node is substantially equal to the first voltage.

20. The latch of claim 15 wherein the signal level detector comprises an inverter.

21. The latch of claim 20 wherein the inverter that comprises the signal level detector comprises:
- a first transistor; and
- a second transistor coupled in series with the first transistor, the second transistor having a second drive strength that is greater than that of the first transistor.

* * * * *